United States Patent
Robertson et al.

(10) Patent No.: US 9,444,456 B2
(45) Date of Patent: Sep. 13, 2016

(54) CIRCUIT AND METHOD FOR POWERING AN INTEGRATED CIRCUIT HAVING FIRST AND SECOND POWER REGULATORS RESPECTIVELY CONFIGURED AND ARRANGED TO PROVIDE REGULATED POWER AT MAIN AND STANDBY POWER LEVELS

(75) Inventors: Peter Robertson, Sunnyvale, CA (US); Andre Gunther, Sunnyvale, CA (US); Kevin Mahooti, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 714 days.

(21) Appl. No.: 13/187,274

(22) Filed: Jul. 20, 2011

(65) Prior Publication Data

US 2013/0021091 A1    Jan. 24, 2013

(51) Int. Cl.
| | |
|---|---|
| G06F 1/26 | (2006.01) |
| G06F 1/32 | (2006.01) |
| H03K 19/00 | (2006.01) |
| G06F 1/06 | (2006.01) |
| G06F 1/08 | (2006.01) |

(52) U.S. Cl.
CPC ......... *H03K 19/0008* (2013.01); *G06F 1/3203* (2013.01); *G06F 1/06* (2013.01); *G06F 1/08* (2013.01); *G06F 1/26* (2013.01); *G06F 1/324* (2013.01); *G06F 1/3296* (2013.01); *Y02B 60/1217* (2013.01)

(58) Field of Classification Search
CPC ...... G06F 1/3203; G06F 3/0418; G06F 1/08; G06F 1/324; G06F 1/26; G06F 1/3296
USPC ........................................................ 713/320
See application file for complete search history.

(56) References Cited

U.S. PATENT DOCUMENTS

| | | | |
|---|---|---|---|
| 4,614,880 A | 9/1986 | Go et al. | |
| 6,601,176 B1* | 7/2003 | Alexander | G06F 1/24 713/320 |
| 6,798,086 B2* | 9/2004 | Utsunomiya | 307/154 |
| 7,362,079 B1 | 4/2008 | Maheedhar et al. | |
| 7,397,226 B1 | 7/2008 | Mannama et al. | |
| 2005/0097377 A1* | 5/2005 | Chou | G06F 1/3203 713/320 |
| 2005/0144492 A1* | 6/2005 | Yun et al. | 713/300 |
| 2009/0315591 A1 | 12/2009 | Pyeon et al. | |
| 2012/0301169 A1 | 11/2012 | Kim et al. | |
| 2013/0021090 A1 | 1/2013 | Robertson et al. | |

FOREIGN PATENT DOCUMENTS

| | | |
|---|---|---|
| CN | 101042561 A | 9/2007 |
| CN | 101278459 A | 10/2008 |

* cited by examiner

*Primary Examiner* — Xuxing Chen

(57) ABSTRACT

Power supply is facilitated. In accordance with one or more embodiments, a power regulator circuit includes first and second regulators and a controller for controlling operation of the power regulator circuit in standby and normal operational modes. The first and second regulators respectively provide regulated power at main and standby power levels, the standby power level being lower than the main power level. For the standby mode, the controller operates the second regulator for supplying power to an integrated circuit at the standby power level. For transitioning to the normal mode, the controller turns the first regulator on while continuing to operate the second regulator for supplying power to the integrated circuit during a start-up period. After a start-up period (e.g., when the first regulator is up to full power), the controller operates the first regulator for supplying power for operating the processor in a high-frequency mode.

20 Claims, 3 Drawing Sheets

CIRCUIT AND METHOD FOR POWERING AN INTEGRATED CIRCUIT HAVING FIRST AND SECOND POWER REGULATORS RESPECTIVELY CONFIGURED AND ARRANGED TO PROVIDE REGULATED POWER AT MAIN AND STANDBY POWER LEVELS

In many electronic circuit applications, various circuits are not powered at certain times, during which times the circuits can be placed in a standby mode in which the circuits draw less than full power. For example, many low power microcontrollers include mixed signal blocks, such as those including data converters, temperature sensors, comparators, or voltage references. In many implementations, not all blocks are required all the time, and often, all circuit blocks can be powered down until a time at which the circuits are needed. This approach can save power, which can be particularly useful in battery-powered applications.

Generally, a standby mode is a mode in which external power is applied, but current consumption has been reduced by powering down internal blocks and/or other circuit components. When access to functional blocks is needed, recovery from standby involves the power up of internal blocks so that the internal blocks can resume their processing functions. However, the rapid power up of internal blocks can be challenging to implement, as many power supplies require time in which to ramp up to providing full power, as do the functional circuit blocks being supplied. These and other issues continue to present challenges to the implementation of circuits that consume low power, yet operate to rapidly respond to requests.

Various example embodiments are directed to power supply circuits and approaches, and to addressing various challenges including those discussed above.

According to an example embodiment, a power regulator circuit includes first and second power regulators and a controller. The first and second power regulators respectively provide regulated power at main and standby power levels, with the standby power level being less than the main power level (e.g., less than half). For standby operation, the controller outputs a control standby signal to operate the second power regulator for supplying power to an integrated circuit at the standby power level. For startup operation, the controller outputs a startup control signal to turn the first power regulator on, while continuing to operate the second power regulator for supplying power to the integrated circuit during a start-up period, and also outputs a start signal for operating a processor in the integrated circuit in a low-frequency mode via the second power regulator. After the start-up period (e.g., when the first regulator is operating to provide full power), the controller operates the first power regulator for supplying power at the main power level for operating the processor in a high-frequency mode, and may optionally turn the second regulator off.

Another example embodiment is directed to a method for powering an integrated circuit having first and second power regulators that respectively provide regulated power at main and standby power levels, the standby power level being less than half of the main power level. In a standby mode, a control standby signal is output to operate the second power regulator for supplying power to an integrated circuit at the standby power level. In a startup mode, a startup control signal is output to turn the first power regulator on, while continuing to operate the second power regulator for supplying power to the integrated circuit during a start-up period, and a start signal is output for operating a processor in the integrated circuit in a low-frequency mode via the second power regulator. After the start-up period, a main operation control signal is output to operate the first power regulator for supplying power for operating the processor in a high-frequency mode (the second and/or other power regulators may be turned off).

Another example embodiment is directed to an integrated circuit chip that operates in main and standby power modes. The chip includes a plurality of functional circuit blocks, a clock generation circuit that generates a clock signal, and a microprocessor that operates at a frequency based upon the received clock signal. The chip also includes first and second power regulators and a power control circuit. The first and second power regulators respectively provide regulated power at main and standby power levels, with the standby power level being less than half of the main power level. The power control circuit enters a standby mode in which the integrated circuit chip is not serving requests, by outputting a standby signal to operate the second power regulator for supplying power to the circuit at the standby power level. The power control circuit enters a startup mode in response to a request for accessing the integrated circuit chip, by outputting a startup control signal to turn the first power regulator on while continuing to operate the second power regulator for supplying power to the integrated circuit during a start-up period, and further outputting a start signal for operating the microprocessor circuit in a low frequency mode via the second power regulator. In response to the first power regulator reaching a full power level, the power control circuit enters a main operation mode by operating the first power regulator for supplying power at the main power level for operating the microprocessor in a high-frequency mode.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

Figure 1:
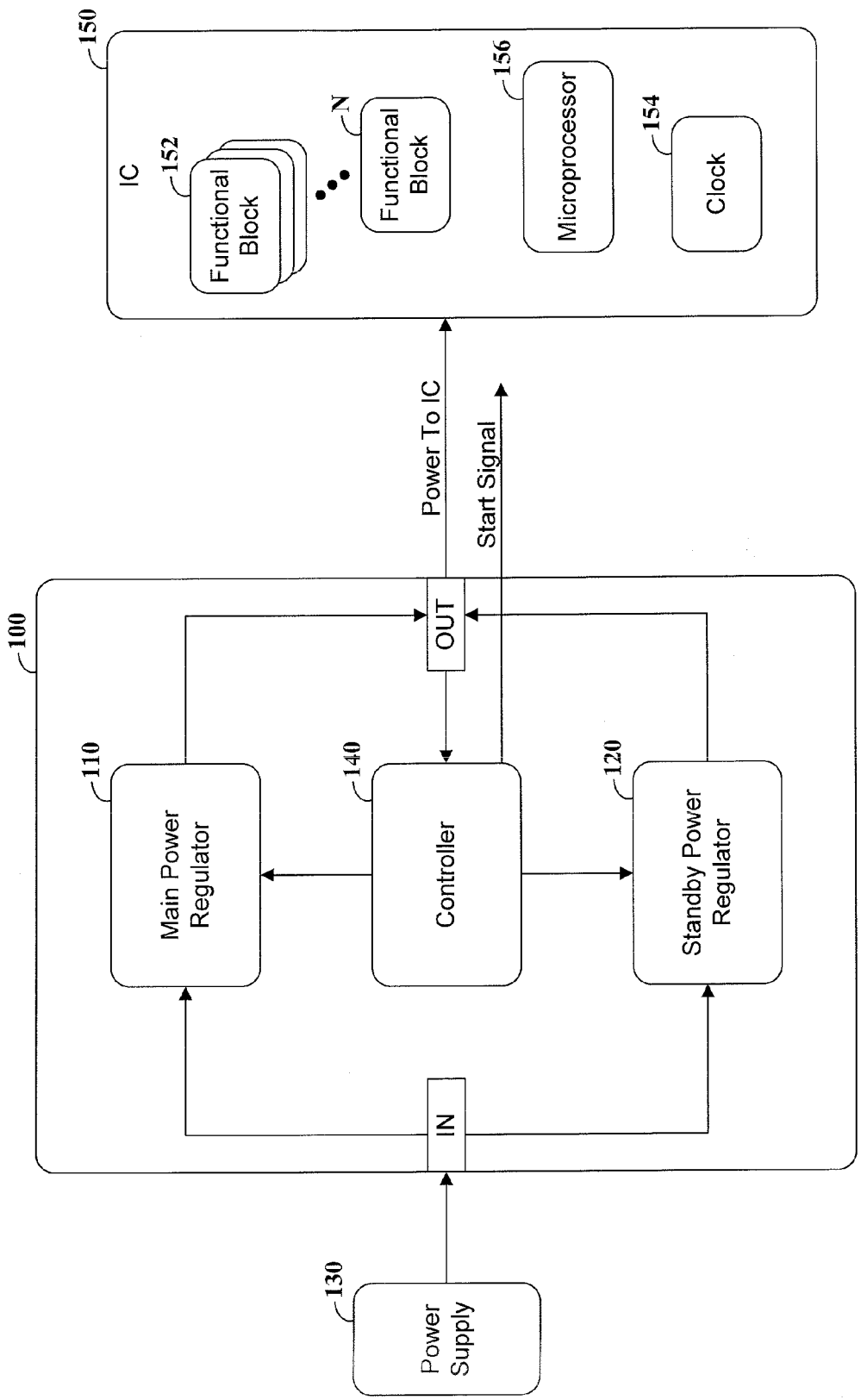
FIG. 1 shows a power regulator, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of circuits, devices and systems for and/or involving power supply and power supply control. While the present invention is not necessarily limited in this context, various aspects of the invention may be appreciated through a discussion of related examples.

In accordance with various example embodiments, a power regulator circuit includes at least two power control circuits (e.g., voltage regulators), respectively providing what may be referred to generally as standby power and main power and corresponding to low-power and high-power operational states. A first main power control circuit provides a high-power output for normal operation, and second standby power control circuit provides a low-power output for standby operation. Accordingly, the standby power control circuit powers standby functions of an integrated circuit in which the power regulator circuit is to be employed, during a standby mode. When the power regulator circuit is in standby mode, the main power control circuit activates to provide the high-power output, in response to a stimulus (e.g., a call to circuits powered by the main power control circuit).

The standby power control circuit is also responsive to the stimulus by providing power when entering a normal operational mode from the standby mode, to initially power circuits during the transition from the standby mode to the normal operational mode. For example, when powering a microprocessor, the standby power control circuit can operate the microprocessor at a low frequency while the main power control circuit ramps up to full power. This facilitates a fast start-up of the processing circuit, relative to waiting for the main power control circuit to reach full power. In various implementations, this transition power as provided by the standby power control circuit may be provided with a low-complexity standby circuit (e.g., relative to the main power control circuit). This approach may provide power at relatively low consistency or accuracy but sufficient to initially power the microprocessor. Further, the standby power control circuit may operate to provide power at a level higher than standby power, for short periods of time during this transition.

In various implementations, the power regulator is coupled to an integrated circuit to provide fast recovery of the integrated circuit from a standby mode, to facilitate the fast response of powered circuits to external stimulus (e.g., in less than about two microseconds). Various embodiments are directed to applications benefitting from such a fast recovery approach. For example, a personal electronic device such as a watch or toy, a hand-held device, a computer device or a media device may benefit from such approaches. Accordingly, a stimulus as referred to herein and as relevant to entering a start-up mode may involve a user-initiated input such as the push of a button or touch-screen interaction, or an automated input involving a call to a particular function.

The standby power circuit powers components of the integrated circuit while the main power control circuit is powering on. This approach can be implemented, for example, using a standby power control circuit that provides low and inaccurate current, relative to the main power control circuit, but does so while consuming significantly less power than the main power control circuit (e.g., consuming about 1% of the power consumed by the main power control circuit, while providing about 10% of the current provided by the main power control circuit). In some implementations, the main power control circuit uses a replica feedback approach that consumes additional power but provides the capability of delivering a larger amount of current at a higher level of voltage accuracy, relative to that provided by the lower-power standby regulator. The standby power control circuit can be implemented without replica feedback, to operate a microprocessor at low power (low frequency). In these contexts, the main power control circuit can be implemented using a high accuracy feedback type regulator, and the standby power control circuit can use a low accuracy (essentially unregulated) circuit, providing power at a level selected to be just sufficient to run the microprocessor in a particular application (e.g., less than a microampere).

Various aspects of the present invention are directed to addressing slow response times to an external stimulus or internal time event which requires recovery to full power. Other aspects are directed to implementations in which a conventional power regulator is not turned off in standby, to operate at a reduced power level.

In various embodiments, a power regulator including main and standby voltage regulators as discussed herein is implemented as a circuit block that may be implemented in a mixed-signal integrated circuit, such as a microcontroller or data converter with a digital interface, and converts external voltage to internal voltage levels. The power regulator can be placed and routed in a manner that is similar to other blocks of the integrated circuit, and uses an external power supply of the integrated circuit as an input, with internal power rails of the integrated circuit being outputs. The power regulator also has digital control inputs and status outputs, which are used to control and signal transitions between operational modes, such as those including normal (e.g., high or full power) and standby (low or standby power) operation as discussed herein. During standby mode, all or most processing power of the integrated circuit is not used, and most of the functional blocks can be turned off, with internal power rails being powered by the standby regulator.

In addition, power regulators as discussed herein can be used in analog front-end blocks with digital interfaces in which the analog blocks are not used all the time. This approach can be implemented to effect reduced power consumption under conditions in which all blocks are not used. For example, a transition to standby can be implemented when a standby regulator is sufficient to power those analog blocks being used, or when all blocks are idle. A transition to normal power operation can be effected as otherwise discussed herein.

In many implementations, standby voltage regulators as discussed herein are operated to provide power at a level that is less than half of the normal power level, and in some instances, less than about 10% of the normal power level. In some applications, the standby voltage regulator is configured to consume very low power while providing a relatively high level of current (e.g., consuming about 1% of the power consumed by the main regulator, while providing about 10% of the current as provided by the main regulator). For various applications, the power provided by the standby regulator may be inconsistent or inaccurate, relative to the main power regulator, but sufficient to initiate powering of functional blocks and/or processors during a start-up mode in transition from standby to normal operation. For instance, the standby regulator can provide essentially unregulated power, at a consumption rate that is sufficiently low to facilitate long-term operation (e.g., several years of battery operation for a toy, watch, hand-held device or other electronic component).

Some embodiments are directed to controlling power for a microcontroller chip as follows. Software on the chip determines when the processing tasks have been completed and the chip can be put into standby mode. Based on this determination, the processor clocks are turned off and the power regulator is signaled to transition into a standby mode. The standby regulator is turned on, and when this turn-on is verified, the main regulator is turned off. The standby regulator is designed to consume only a very small amount of power relative to the main regulator (e.g., as discussed above).

In response to an external stimulus, such as a timer interrupt or a signal coming from outside the chip, the standby regulator outputs enough current to transition the chip from standby to normal mode (e.g., with the transition corresponding to a startup mode as discussed herein), and control logic sends a start signal to a clock generation unit of the microprocessor. Since the power is already turned on via the standby regulator, the oscillator starts to power the microprocessor immediately. Also in response to the stimulus, the main regulator is signaled to turn on, which generally involves powering up an internal regulation mechanism, which may involve a delay until full power level that is sufficient to operate the microprocessor is provided. During this delay, the standby regulator supplies enough current for the microprocessor to start in a low-frequency mode. After the main regulator has powered up to provide sufficient current for the microprocessor to operate at full frequency, the standby regulator can be turned off (if desired, or left on considering relatively low power usage) and the device can operate in normal mode.

In some embodiments, the standby regulator provides sufficient processing power to service the external stimulus as discussed above. In these embodiments, the standby regulator operates to power the processor to serve the stimulus, and then remains in the standby mode, via which the main regulator is not necessarily started. In other embodiments, the standby regulator also provides sufficient processing power for serving the external stimulus, or at least for beginning to serve the external stimulus, and the main regulator takes over the provision of power for serving the external stimulus, once it is powered sufficiently to do so.

Turning now to the figures, FIG. 1 shows a power regulator 100 for providing power to an integrated circuit, in accordance with another example embodiment of the present invention. The regulator 100 may provide power to a variety of different types of integrated circuits, with integrated circuit 150 shown by way of example. The power regulator 100 includes a first (main) power regulator 110, and second (standby) power regulator 120 that respectively provide regulated power at main and standby power levels, as received from a power supply 130. Generally, the standby power level is significantly less than the main power level, and may involve half or a small percentage of current (e.g., less than 10%) of the main power level as provided by the main power regulator 110.

The power regulator 100 also includes a controller 140, which operates to control the main and standby power regulators 110 and 120 for operating in normal and standby modes, and transitioning therebetween. In the standby mode, the controller 140 outputs a control standby signal to operate the standby power regulator for supplying power to an integrated circuit at the standby power level. This standby mode may, for example, be triggered in response to an idle period, or to the integrated circuit completing tasks corresponding to a particular request. Such conditions may be detected by the controller 140 using one or more of a variety of approaches, such as by monitoring the integrated circuit or receiving a signal indicative of a status of the integrated circuit.

The controller 140 further operates in a startup mode to transition from the standby mode to a normal operational mode, by outputting a startup control signal to turn the main power regulator on while continuing to operate the second power regulator for supplying power to the integrated circuit during a start-up period. Also during the startup mode, the controller 140 outputs a start signal for operating a processor in the integrated circuit in a low-frequency mode (e.g., by operating an oscillator at low frequency), via the standby power regulator. This low-frequency mode may, for example, correspond to a power level that provides about 10% of the current provided by the main power regulator.

After the start-up period, in completing a transition to a normal operational mode, the controller 140 operates the main power regulator to supply power at the main power level for operating the processor in a high-frequency mode (e.g., via control of an oscillator). This transition may occur, for example, in response to monitoring and detecting that the main power regulator is operating at full power level, or at a power level that is sufficient for powering the integrated circuit for carrying out one or more tasks. In some embodiments, the control 140 also outputs a control signal to turn the standby regulator off when entering the normal operational mode.

The controller 140 may control entry to the startup mode using one or more of a variety of approaches, as may be suited to different applications. In one implementation, the controller 140 enters the startup mode in response to a request for accessing the integrated circuit, such as for carrying out certain functions performed by the integrated circuit. In other implementations, the controller 140 is configured to evaluate such requests to ascertain power needed to serve the requests, and controls further entry to the normal operation mode and the starting of the main power regulator 110 based upon the evaluation. For example, if a request may be served by operating the integrated circuit at a low power level that the standby power regulator can provide, the controller 140 controls the standby power regulator 120 to operate the integrated circuit, and provides other appropriate signals (e.g., to start an oscillator for operating a processor), without necessarily starting the main power regulator 110. In still other implementations, the controller 140 uses the standby power regulator 120 to initially power the integrated circuit to begin serving a request during the startup mode, and transitions the power supply to the main power regulator 110 after it has powered up, for completing the requested service. Further, the startup power level, as provided to the integrated circuit by the standby power regulator 120, may be controlled at a higher level, relative to the standby power level, during the startup period.

In other embodiments, the controller 140 is configured to output control signal(s), such as a status signal, to control the operation of circuits in the integrated circuit. For example, the controller 140 may output control signals to power down functional blocks in the integrated circuit, for entering the standby mode, while operating other circuits at the standby power level (e.g., a processor can be maintained at a standby power level, with a clock operating the processor being turned off, facilitating rapid start-up).

Various embodiments are directed to a power regulator integrated with functional circuits, such as maybe combined with the power regulator circuit 100 and the integrated circuit 150. The integrated circuit 150 includes a plurality of functional circuit blocks 152-N, a clock generation circuit 154, and a microprocessor 156 coupled to receive the clock signal and configured to operate at a frequency based upon the received clock signal. The controller 140 outputs signals to operate the functional circuit blocks, clock generation circuit and microprocessor, in a manner such as described herein.

Figure 2:
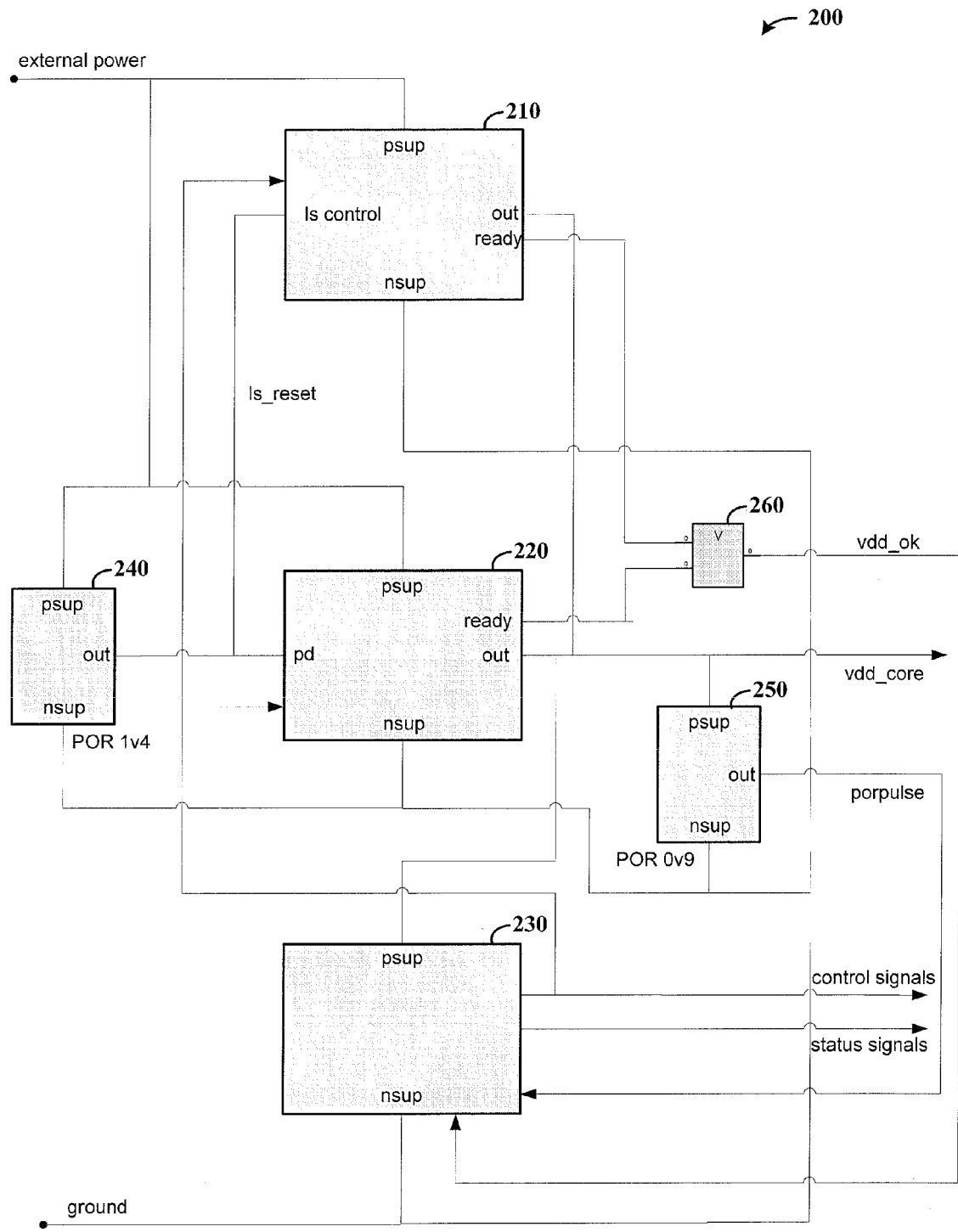
FIG. 2 shows another power regulator, in accordance with another example embodiment of the present invention.

FIG. 2 shows another power regulator 200, in accordance with another example embodiment of the present invention. The regulator 200 includes a main regulator 210, a standby regulator 220, and control logic circuitry 230. The power regulator 200 also includes power on reset (POR) circuits 240 and 250, as well as an enable circuit 260 that provides an output for use by a powered circuit to indicate the presence of a voltage at either of the main or standby power regulators. External power is coupled to each of the main and standby regulators 210 and 220, as well as the POR circuit 240. The control logic circuitry 230 and the POR circuit 250 are powered by the internal main and standby regulators 210 and 220.

The POR circuit 240 monitors for external supply power, and provides a power on pulse signal that resets level shifters for control signals at the main power regulator 210. The POR circuit 250 generates a power on pulse signal for an integrated circuit powered by the power regulator 200. The respective main and standby power regulators 210 and 220 are operated using one or more approaches as discussed herein (e.g., as above with FIG. 1 or below with FIG. 3), to use the standby regulator to power circuits during a startup mode while powering up the main regulator. After power-up, the standby regulator can remain on (e.g., is always on), or can be turned off to conserve energy.

The control logic circuitry 230 receives the vdd_ok and porpulse signals, and provides status and control signal outputs for the integrated circuit to respectively indicate the status of the power regulator (e.g., normal or standby mode) and control the operation of one or more circuits therein for mode transitions from both normal to standby and from standby to normal (e.g., via a startup mode as discussed herein).

Figure 3:
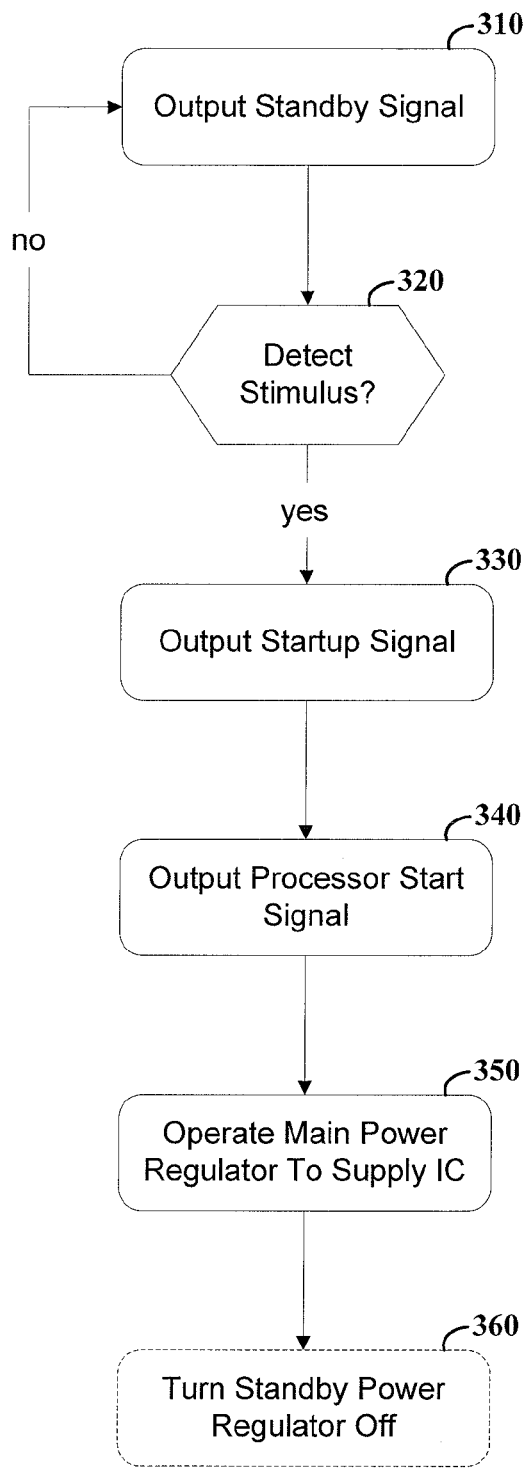
FIG. 3 shows a data flow diagram for powering an integrated circuit in standby and normal modes, in accordance with another example embodiment of the present invention.

FIG. 3 shows a data flow diagram for powering an integrated circuit in standby and normal modes, in accordance with another example embodiment of the present invention. At block 310, a standby signal is output to operate a standby power regulator for supplying power to an integrated circuit at the standby power level. In response to a stimulus at block 320, a startup signal is output at block 330 to turn a main power regulator on while continuing to operate the standby power regulator for supplying power to the integrated circuit during a start-up period, and a processor start signal is output at block 340 for operating a processor in the integrated circuit in a low-frequency mode via the standby power regulator. The respective steps at blocks 330 and 340 may be combined into a single step, with the same signal being output for both operations and/or multiple signals being output in one step.

After the start-up period, such as for entering a full power/normal operation mode of the integrated circuit, the main power regulator is operated at block 350 for supplying power for operating the processor in a high-frequency mode. Optionally, a control signal is output at block 360 to turn the standby regulator off.

Based upon the above discussion and illustrations, those skilled in the art will readily recognize that various modifications and changes may be made to the present invention without strictly following the exemplary embodiments and applications illustrated and described herein. For example, additional power regulators may be implemented in a manner similar to that of one or both of the main and standby regulators as discussed herein. Such modifications do not depart from the true spirit and scope of the present invention, including that set forth in the following claims. Furthermore, the term "example" as used throughout this document is by way of illustration, and not limitation.

What is claimed is:
1. A power regulator circuit comprising:
first and second power regulators respectively configured and arranged to provide regulated power to an integrated circuit at main and standby power levels and to provide regulated power to internal power rails for powering less than all of the power regulator circuit which includes a first circuit, the standby power level being less than half of the main power level; and
a controller circuit configured and arranged to
in a standby mode, output a standby signal to operate the second power regulator for supplying power to an integrated circuit at the standby power level and to cause the first power regulator, and the first circuit, to be in an off mode in which the first power regulator is directed to consume no current and in which power via the internal power rails is not provided to the first circuit, thereby limiting power consumed by the integrated circuit at the standby power level;
transition from the standby mode to a startup mode, output a startup signal to turn the first power regulator on while continuing to operate the second power regulator for supplying power to the integrated circuit during a start-up period, and output a start signal for operating a processor circuit in the integrated circuit in a low-frequency mode, and
after the start-up period, operating the first power regulator for supplying power at the main power level for operating the processor circuit in a high-frequency mode.

2. The circuit of claim 1, wherein, in the startup mode,
the controller circuit is configured to output a signal for operating an oscillator to drive the processor circuit in the low-frequency mode,
the second power regulator is configured to provide the regulated power to the oscillator for operating the oscillator at low frequency to drive the processor circuit in the low-frequency mode, and
the controller circuit is configured to, in response to the first power regulator providing a threshold power level, control the first power regulator to provide the regulated power to the oscillator for operating the oscillator at a high frequency to power the processor circuit in a high-frequency mode.

3. The circuit of claim 1, wherein the controller circuit is configured and arranged
with circuitry to operate the second power regulator in the standby mode, and to operate both the first and second power regulators simultaneously during the start-up period in response to an external stimulus, and for providing a signal for causing an oscillator to start driving the processor circuit in the low frequency mode and switching an oscillator to the high-frequency mode after the start-up period, and
to monitor the power level of the first power regulator and, in response to the first power regulator providing power at a power threshold, terminate the startup mode by turning the second power regulator off and controlling the first power regulator for supplying the power for operating the processor circuit in the high-frequency mode.

4. The circuit of claim 1, wherein the controller circuit is configured and arranged to output the startup signal to control the first power regulator for entering the startup mode from the standby mode in response to receiving a request for accessing the integrated circuit, and wherein the first circuit is configured and arranged to provide a clock signal coupled to drive the processor circuit.

5. The circuit of claim 1, wherein the controller circuit is configured and arranged to, in response to receiving a request for accessing the integrated circuit,
output a control signal to control the second power regulator for supplying power to the integrated circuit, and output the start signal for operating the processor circuit in the low-frequency mode to serve the request, and
after the request has been served, output the standby signal to operate the second power regulator for supplying power to the integrated circuit at the standby power level, and outputting a control signal for turning the processor circuit off.

6. The circuit of claim 1, wherein the controller circuit is configured and arranged to, in the startup mode, operate the second power regulator for supplying power to the integrated circuit at a startup power level that is higher than the standby power level.

7. The circuit of claim 1, wherein the second power regulator is configured and arranged for supplying power to the integrated circuit in the startup mode at a power level that is higher than the standby power level, to operate the processor circuit in the low-frequency mode.

8. The circuit of claim 1, wherein the controller circuit is configured to output a control signal to power off a plurality of circuits, including a circuit other than the first power regulator and the first circuit, in the integrated circuit for entering the standby mode, thereby causing the first power regulator to be in the off mode.

9. The circuit of claim 1, wherein the controller circuit is configured to output the standby and startup signals by outputting a status signal indicative of the respective standby and startup modes.

10. The circuit of claim 1, wherein the controller circuit is configured to output the start signal for operating a processor circuit in the integrated circuit in a low-frequency mode by outputting a signal to operate a clock generation circuit to oscillate at low frequency for operating the processor circuit.

11. A power regulator circuit comprising:
first and second power regulators respectively configured and arranged to provide regulated power at main and standby power levels, the standby power level being less than half of the main power level; and
a controller circuit configured and arranged to
in a standby mode, output a standby signal to operate the second power regulator for supplying power to an integrated circuit at the standby power level,
transition from the standby mode to a startup mode, output a startup signal to turn the first power regulator on while continuing to operate the second power regulator for supplying power to the integrated circuit during a start-up period, and output a start signal for operating a processor circuit in the integrated circuit in a low-frequency mode, and
after the start-up period, operating the first power regulator for supplying power at the main power level for operating the processor circuit in a high-frequency mode, wherein, in the standby mode, the controller circuit is configured and arranged with the first power regulator to operate that first power regulator in an off mode in which the first power regulator is directed to consume no current;
in the startup mode,
the controller circuit is configured to output a signal for operating an oscillator to drive the processor circuit in the low-frequency mode using power from the second power regulator, and
the second power regulator is configured and arranged to provide regulated power to the oscillator at a startup power level until the start-up period has ended and the first power regulator is operating at the main power level; and
the controller circuit includes circuitry configured and arranged to operate the oscillator at the high-frequency using power from the first power regulator at the end of the start-up period, and to disable the second power regulator after the start-up period while the first power regulator powers the oscillator for providing the main power level.

12. A method for powering an integrated circuit having first and second power regulators respectively configured and arranged to provide regulated power at main and standby power levels, the standby power level being less than half of the main power level, the method comprising:
in a standby mode, outputting a standby signal to operate the second power regulator for supplying power to the integrated circuit at the standby power level and to,
transitioning from the standby mode to a startup mode, outputting a startup signal to turn the first power regulator on while continuing to operate the second power regulator for supplying power to the integrated circuit during a start-up period, and outputting a start signal for operating a processor circuit in the integrated circuit in a low-frequency mode, and
after the start-up period, operating the first power regulator for supplying power for operating the processor circuit in a high-frequency mode, wherein, in the standby mode, the first power regulator operates in an off mode in which the first power regulator is directed to consume no current;
in the startup mode,
an oscillator is operated to drive the processor circuit in the low-frequency mode using power from the second power regulator, and the oscillator is operated at the high-frequency using power from the first power regulator at the end of the start-up period, and the second power regulator is disabled after the start-up period while the first power regulator powers the oscillator for providing the main power level.

13. The method of claim 12, wherein
outputting a start signal for operating a processor circuit in the integrated circuit in a low-frequency mode includes outputting a start signal for operating an oscillator at a low frequency to drive the processor circuit in the low-frequency mode during the start-up period, and
operating the first power regulator for supplying the power for operating the processor circuit in the high-frequency mode includes operating the oscillator at a high frequency via the first power regulator at the end of the start-up period.

14. The method of claim 12, further including
in the startup mode, monitoring the power level of the first power regulator, and
outputting a control signal to turn the second power regulator off in response to the monitored power level of the first power regulator reaching a power threshold.

15. The method of claim 12, further including,
in response to receiving a request for accessing the integrated circuit, outputting the standby signal to control the second power regulator for supplying power to the integrated circuit, and outputting the start signal for operating the processor circuit in the low-frequency mode to serve the request, and after the request has been served, outputting the standby signal to operate the second power regulator for supplying power to the integrated circuit at the standby power level, and outputting a signal for turning the processor circuit off.

16. The method of claim 12 wherein, in the startup mode, continuing to operate the second power regulator for supplying power to the integrated circuit during a start-up period includes operating the processor circuit at a startup power level that is higher than the standby power level.

17. The method of claim 12, wherein outputting a start signal for operating a processor circuit in the integrated circuit in a low-frequency mode via the second power regulator includes outputting a signal to operate a clock generation circuit to oscillate at low frequency for operating the processor.

18. The method of claim 12, wherein outputting a startup signal to turn the first power regulator on while continuing to operate the second power regulator for supplying power to the integrated circuit during a start-up period, and outputting a start signal for operating a processor circuit in the integrated circuit include outputting the signals and operating the second power regulator in response to receiving a request for accessing the integrated circuit.

19. A method for powering an integrated circuit having first and second power regulators respectively configured and arranged to provide regulated power at main and standby power levels, the standby power level being less than half of the main power level, the method comprising:

in a standby mode, outputting a standby signal to operate the second power regulator for supplying power to the integrated circuit at the standby power level and to, transitioning from the standby mode to a startup mode, outputting a startup signal to turn the first power regulator on while continuing to operate the second power regulator for supplying power to the integrated circuit during a start-up period, and outputting a start signal for operating a processor circuit in the integrated circuit in a low-frequency mode, and after the start-up period, operating the first power regulator for supplying power for operating the processor circuit in a high-frequency mode, wherein outputting a start signal for operating a processor circuit in the integrated circuit in a low-frequency mode includes outputting a signal for operating an oscillator to power the processor circuit in the low-frequency mode, continuing to operate the second power regulator for supplying power to the integrated circuit during a start-up period includes operating the second power regulator to provide the regulated power to the oscillator for operating the oscillator at low frequency to operate the processor circuit in the low-frequency mode, and operating the first power regulator for supplying power and for operating the processor circuit in a high-frequency mode includes outputting, in response to the first power regulator providing a threshold power level corresponding to when the first power regulator is operating to provide full power, a control signal to control the first power regulator to provide the regulated power to the oscillator for operating the oscillator at a high frequency to power the processor circuit in a high-frequency mode.

20. An integrated circuit chip comprising:
a plurality of functional circuit blocks;
a clock generation circuit configured to generate a clock signal;
a microprocessor circuit coupled to receive the clock signal and configured to operate based upon the received clock signal;
an oscillator configured and arranged to drive the microprocessor circuit in a low frequency mode and in a high frequency mode by respectively oscillating at a low frequency and oscillating at a high frequency;
first and second power regulators respectively configured and arranged to provide regulated power at main and standby power levels, the standby power level being less than half of the main power level; and
a power control circuit configured and arranged to
enter a standby mode in which the integrated circuit chip is not serving requests, by outputting a standby signal to operate the second power regulator for supplying power to the circuit at the standby power level, and by controlling the oscillator in an off state and, in response to receiving a request for accessing the integrated circuit chip while the microprocessor circuit is not powered, enter a startup mode by outputting a startup signal to turn the first power regulator on while continuing to operate the second power regulator and supplying standby power to the integrated circuit by operating the oscillator at the low frequency using the standby power during a start-up period, and outputting a start signal for operating the microprocessor circuit in a low-frequency mode via the second power regulator and the oscillator during the start-up period, and in response to the first power regulator reaching a full power level, enter a main operation mode by operating the first power regulator for supplying power to the oscillator at the main power level for operating the oscillator at the high frequency and operating the microprocessor in a high-frequency mode.

* * * * *